United States Patent
Miyata (10) Patent No.: US 9,640,629 B1
(45) Date of Patent: May 2, 2017

(54) SEMICONDUCTOR DEVICE AND METHOD OF MANUFACTURING THE SAME

(71) Applicant: KABUSHIKI KAISHA TOSHIBA, Tokyo (JP)

(72) Inventor: Toshitaka Miyata, Ota Tokyo (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/253,821

(22) Filed: Aug. 31, 2016

(30) Foreign Application Priority Data

Mar. 10, 2016 (JP) .................. 2016-047486

(51) Int. Cl.
| | |
|---|---|
| H01L 21/8234 | (2006.01) |
| H01L 29/49 | (2006.01) |
| H01L 29/423 | (2006.01) |
| H01L 21/28 | (2006.01) |
| H01L 29/08 | (2006.01) |
| H01L 29/66 | (2006.01) |
| H01L 21/8238 | (2006.01) |
| H01L 21/285 | (2006.01) |

(52) U.S. Cl.
CPC .... *H01L 29/4983* (2013.01); *H01L 21/28114* (2013.01); *H01L 21/82345* (2013.01); *H01L 21/823842* (2013.01); *H01L 29/0847* (2013.01); *H01L 29/4238* (2013.01); *H01L 29/42372* (2013.01); *H01L 29/42376* (2013.01); *H01L 29/6653* (2013.01); *H01L 21/28518* (2013.01)

(58) Field of Classification Search
CPC ...... H01L 21/64; H01L 21/70; H01L 21/8232
See application file for complete search history.

(56) References Cited

U.S. PATENT DOCUMENTS

2013/0049122 A1  2/2013  Miyata et al.
2016/0163882 A1* 6/2016  Owada ............. H01L 27/11568
                                                257/325

FOREIGN PATENT DOCUMENTS

| JP | 2007-294497 | 11/2007 |
| JP | 2008-288402 | 11/2008 |
| JP | 2013-045953 | 3/2013 |

OTHER PUBLICATIONS

T. Miyata et. al., "Scaling Strategy for Low Power RF Applications with Multi Gate Oxide Dual Work function (DWF) MOSFETs Utilizing Self-Aligned Integration Scheme", Symposium on VLSI Technology Digest of Technical Papers, 2013, pp. T144-T145.

* cited by examiner

*Primary Examiner* — Cheung Lee
(74) *Attorney, Agent, or Firm* — Patterson & Sheridan, LLP

(57) ABSTRACT

According to one embodiment, a semiconductor device includes a substrate and a gate electrode. The gate electrode includes a first electrode formed on the substrate, the first electrode having a first conductive property, with a first insulating film between the first electrode and the substrate, and a second electrode formed on the substrate, the second electrode having a second conductive property different from the first conductive property, with a second insulating film between the second electrode and the substrate. The first electrode is formed in a rectangular shape having a hollow portion. A slit is formed in a side surface of the first electrode extending in a width direction of the gate electrode. The second electrode is formed in the slit and along the side surface of the first electrode that has the slit.

20 Claims, 8 Drawing Sheets

FIG. 9B though even in the DWF-FET,

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2016-047486, filed Mar. 10, 2016, the entire contents of which are incorporated herein by reference.

FIELD

An embodiment of the present disclosure relates to a semiconductor device and a method of manufacturing the same.

BACKGROUND

In an analog RF (Radio Frequency) circuit, it is important to increase the transconductance (Gm) of a MOSFET (Metal-Oxide-Semiconductor Field Effect Transistor), and to increase the output resistance thereof. In a MOSFET having a general structure, it is sometimes necessary to shorten the length of its gate in order to improve the transconductance (Gm). However, shortening the length of the gate decreases the output resistance. Furthermore, there is also a problem of punch-through (destructive discharge), which is likely to occur when high voltage is applied to the drain and the risk of a short circuit between the drain and source is increased.

A DWF-MOSFET (Dual Work Function Metal-Oxide-Semiconductor Field Effect Transistor, hereinafter referred to as DWF-FET) using gate electrodes having different work functions on the source side and the drain side is a technique capable of improving the transconductance (Gm) without shortening the gate length. However, even in the DWF-FET, a problem remains that the gate resistance is increased depending on the layout of the electrodes.

DETAILED DESCRIPTION

In general, according to one embodiment, a semiconductor device includes a substrate and a gate electrode. The gate electrode includes a first electrode formed on the substrate, the first electrode comprising a first material having a first conductive property, with a first insulating film between the first electrode and the substrate, and a second electrode formed on the substrate, the second electrode comprising a second material having a second conductive property different from the first conductive property, with a second insulating film between the second electrode and the substrate. The first electrode is formed in a rectangular shape having a hollow portion. A slit is formed in a side surface of the first electrode extending in a width direction of the gate electrode. The second electrode is formed in the slit and along the side surface of the first electrode that has the slit.

An embodiment of the present disclosure will be described below with reference to the drawings. The embodiment does not limit the present disclosure.

In the embodiment, a semiconductor device includes a first electrode having a first conductive property such as work function and a second electrode having a second conductive property different from the first conductive property. The second conductive property has a different value from the first conductive property. In one example, the first and second conductive properties are both work functions, but with different values. The semiconductor device also includes a contact plug for connecting the first electrode and the second electrode. Since the contact area between the contact plug and the second electrode is large, the gate resistance can be reduced. Furthermore, it is possible to increase the degree of freedom of the layout of a contact plug region where the contact plug is connected. More detailed description will now be provided.

Figure 1:
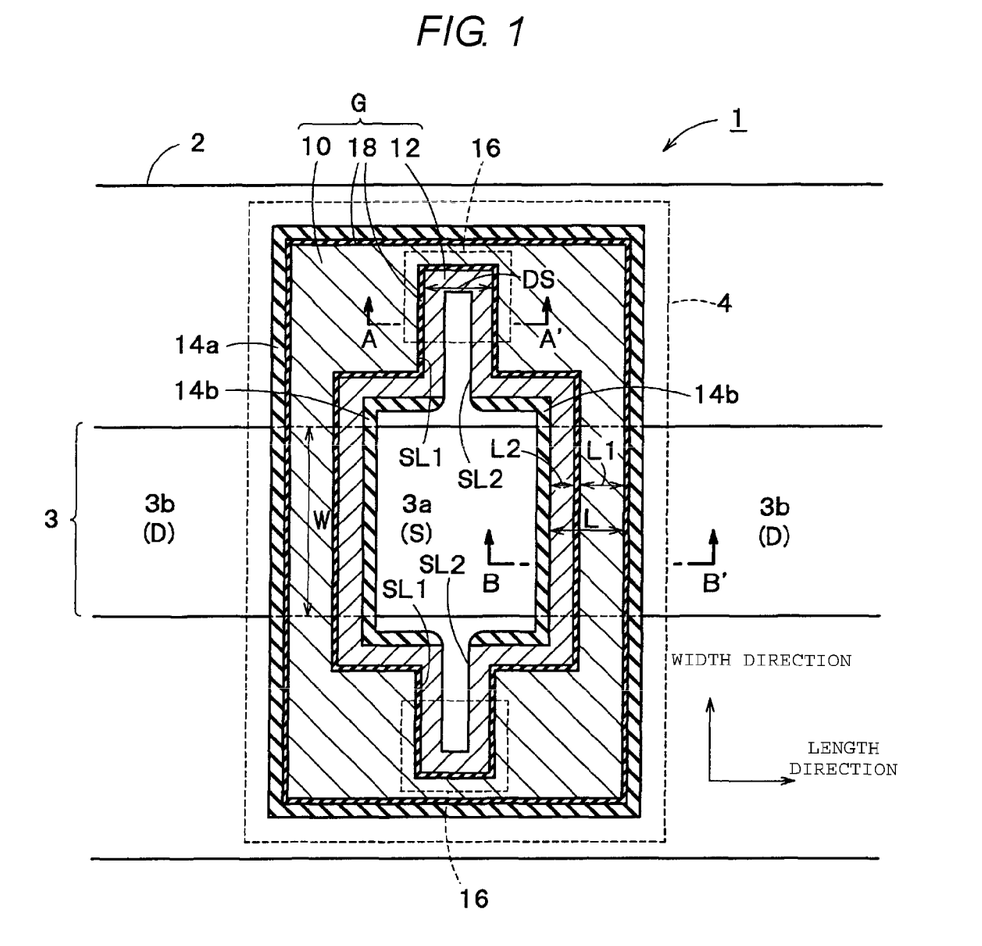
FIG. 1 is a plan view schematically showing the cross section of a semiconductor device according to an embodiment.

FIG. 1 is a diagram schematically showing a cross section in plan view of a semiconductor device 1 according to the embodiment. As shown in FIG. 1, the semiconductor device 1 according to the present embodiment includes a substrate 2, an active region 3, and a transistor, for example, a DWF-FET 4. Note that an interlayer insulating film, a metal wiring and the like are omitted in the following figures.

The substrate 2 is, for example, a semiconductor substrate such as a so-called silicon wafer. The active region 3 is, for example, a region such as a well region formed on the substrate 2. As shown in FIG. 1, the active region 3 is separated from another active region by, for example, an element isolation insulating film such as STI (Shallow Trench Isolation).

In the following description, unless otherwise specified, the width W of an electrode means the gate width on the active region 3. The length L of an electrode means the dimension of the electrode in the gate length direction on the active region 3. Similarly, it is assumed that the length of a first electrode 10 described later is L1, and the length of a second electrode 12 is L2. Further, a width direction means a direction substantially perpendicular to the length direction in FIG. 1. A length direction means a direction substantially parallel to the active region 3 in the direction of the width of the electrode.

The DWF-FET 4 is a transistor formed on the substrate 2 and the active region 3. The DWF-FET 4 mainly includes the first electrode 10, the second electrode 12, a side wall 14 and a contact plug region 16. The first electrode 10 has a first work function. The second electrode 12 has a second work function different from the first work function. A gate electrode G includes the first electrode 10 and the second electrode 12.

As shown in FIG. 1, the first electrode 10 is formed in a rectangular shape having a hollow portion therein in plan view through a first insulating film described later. Further, the first electrode 10 is formed on the substrate 2, and has a slit SL1 in the inner side surface of the hollow rectangle portion. The slit SL1 is formed so as to remove a portion of the side surface of the first electrode 10 in the length direction toward the width direction of the first electrode 10. Further, the slit SL1 is formed in a region different from the active region 3 on the substrate 2. Further, the slit SL1 may be hollow. In addition, the slit SL1 is formed so as not to penetrate the first electrode 10, such that the slit SL1 is not formed through to the opposite side of the first electrode 10.

The second electrode 12 is formed on the substrate 2, so as to contact the inner side surface having the slit of the first electrode 10 through a second insulating film 18. That is, the second electrode 12 is formed to contact both of the substrate 2 and the first electrode 10 through the second insulating film 18. The second electrode 12 is formed so that a slit SL2 exists between the slits in the first electrode 10. In this case, a slit width DS of the slit SL1 formed in the first electrode 10 is larger than twice the dimension L2 of the second electrode 12 in the length direction.

A gate electrode G includes the first electrode 10 and the second electrode 12. The gate electrode G is formed to pass over the active region 3 on the substrate 2. Then, the active region 3 is divided by the first electrode 10 and the second electrode 12 into inner and outer portions of the gate electrode G in plan view. For example, when the first work function is less than the second work function, an inner portion 3a on the second electrode 12 side having the larger work function serves as a source region. An outer portion 3b on the first electrode 10 side having the smaller work function serves as a drain region. Further, in order to interchange the source region and the drain region, the magnitude relation of the first work function and the second work function is interchanged.

Side walls 14a, 14b are provided on the side surfaces of the gate electrode G in order to form the source region and the drain region on the substrate 2. The side walls 14a, 14b are insulating side walls. In the embodiment, no side wall 14 is formed at the slit SL2 in the second electrode 12. That is, the side wall 14a is formed on the outer surface of the first electrode 10, and the side wall 14b is formed on the side surfaces where there is no slit SL2, among the inner surfaces of the second electrode 12.

The contact plug region 16 is a region where a contact plug is arranged for electrically connecting the first electrode 10 and the second electrode 12. In the embodiment, the contact plug region 16 is formed to pass over the slit SL1 in the first electrode 10.

Figure 2A:
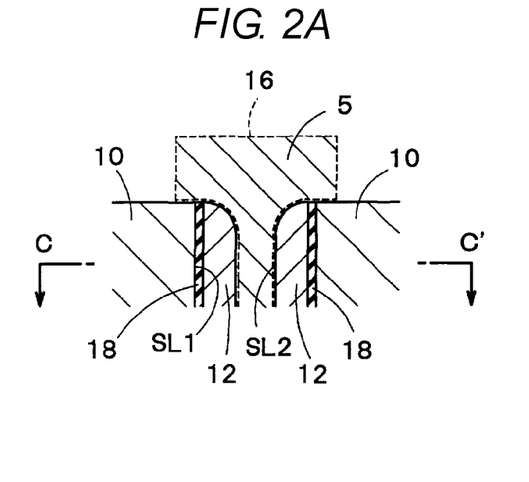
FIGS. 2A and 2B are an end view along lines A-A' and an end view along lines B-B' of FIG. 1, respectively.

FIG. 2A is an end view along lines A-A' of FIG. 1 showing a state in which the contact plug 5 is arranged in the contact plug region 16. FIG. 1 corresponds to lines C-C' of FIG. 2A and FIG. 2B. As shown in FIG. 2A, a second insulating film 18 is formed between the first electrode 10 and the second electrode 12. Then, the contact plug 5 in the contact plug region 16 is in contact with the upper portion of the first electrode 10 and the side surface of the second electrode 12.

Figure 2B:
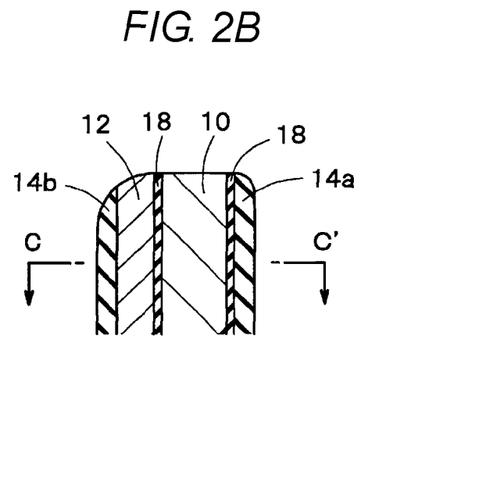

FIG. 2B is an end view along lines B-B' of FIG. 1. As shown in FIG. 2B, the second insulating film 18 is formed between the first electrode 10 and the second electrode 12.

Further, the side wall 14a is formed on the side wall of the first electrode 10, and the side wall 14b is formed on the side wall of the second electrode 12, respectively. As shown in FIG. 2A, the side wall 14b formed on the side surface of the second electrode 12 is removed at the slit SL2 portion.

Figure 3A:
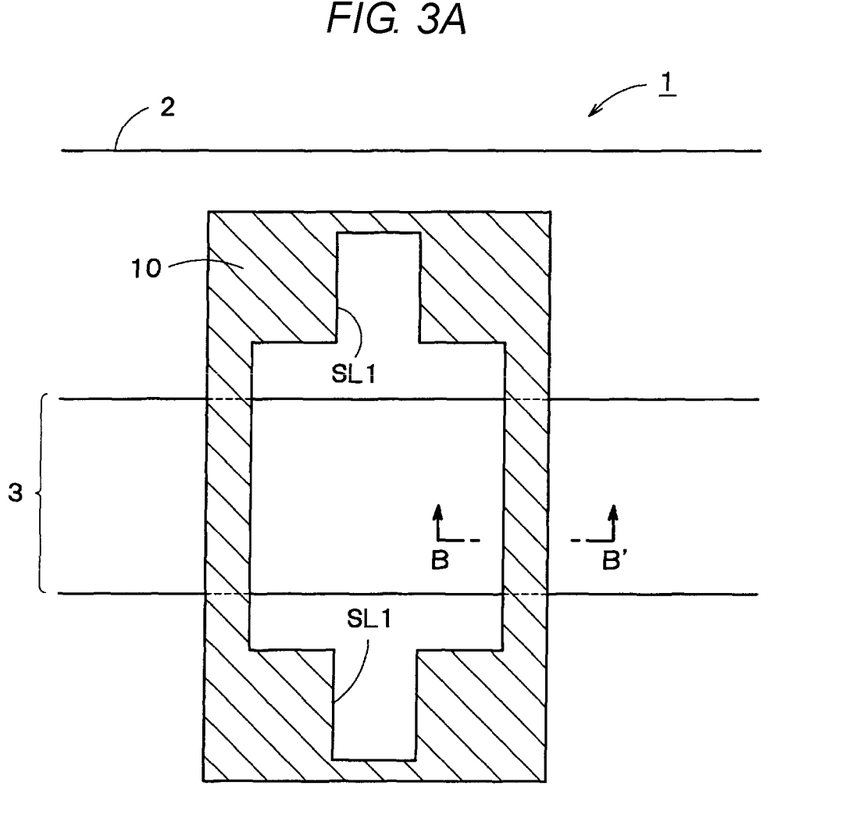
FIGS. 3A and 3B are a plan view and an end view showing the process of the semiconductor device according to the embodiment, respectively.
Figure 3B:
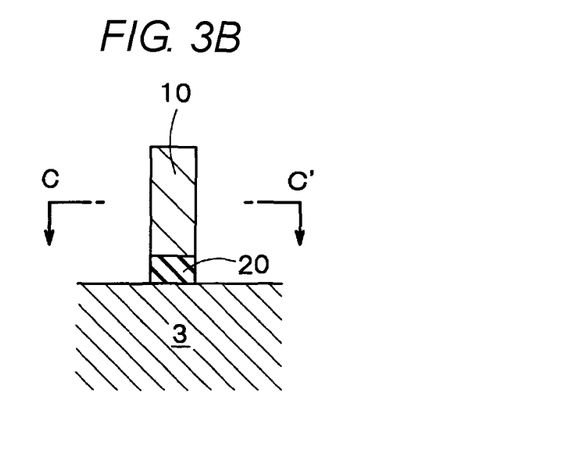
Figure 4A:
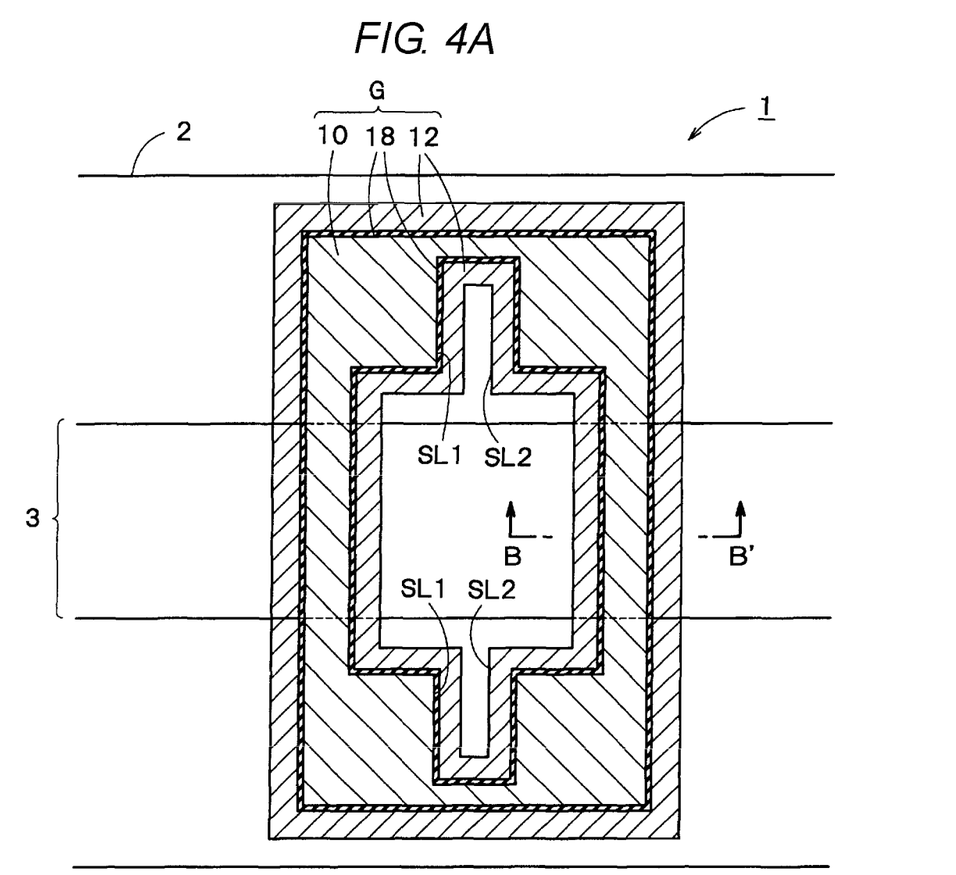
FIGS. 4A and 4B are a plan view and an end view showing the process subsequent to FIGS. 3A and 3B of the semiconductor device according to the embodiment, respectively.
Figure 4B:
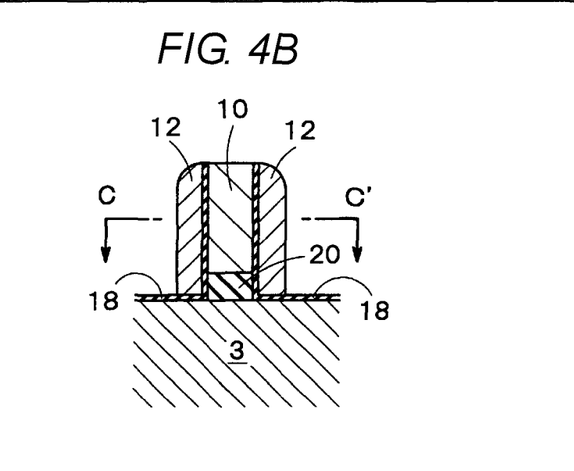
Figure 5A:
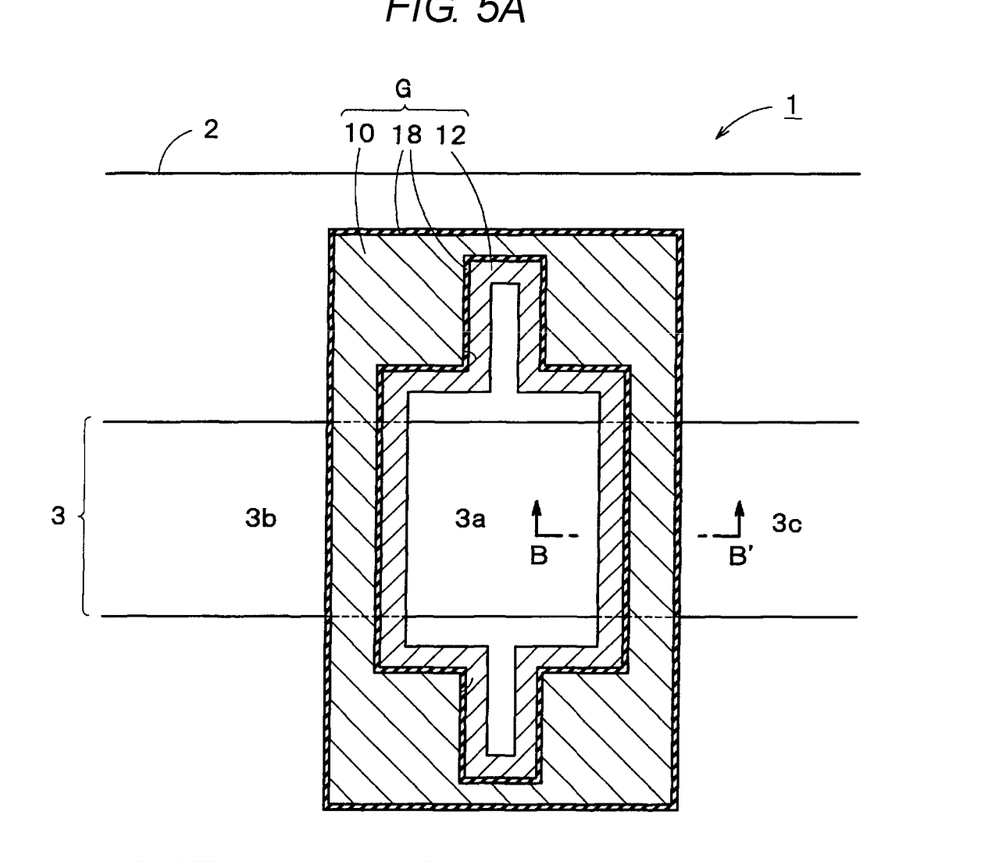
FIGS. 5A and 5B are a plan view and an end view showing the process subsequent to FIGS. 4A and 4B of the semiconductor device according to the embodiment, respectively.
Figure 5B:
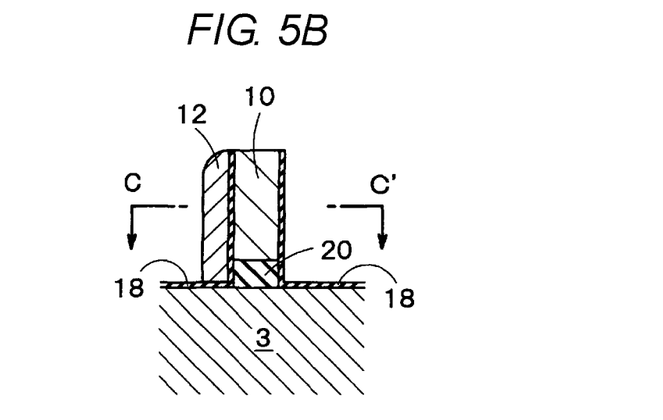

Next, the manufacturing process of the above-mentioned semiconductor device 1 will be described with reference to diagrams. FIGS. 3 to 5 are diagrams showing a manufacturing process of the semiconductor device 1 according to the embodiment.

First, as shown in FIG. 3A, the first electrode 10, having a first work function, is formed on the substrate 2 where the active region 3 is formed. The first electrode 10 is formed to pass over the active region 3 on the substrate 2 through a first insulating film 20 (shown in FIG. 3B). That is, in at least the active region 3, the first insulating film 20 is between the first electrode 10 and the substrate 2. The first electrode 10 has a rectangular shape and has a hollow portion that extends in the length and width directions. Further, the first electrode 10 has a slit on the inner surface thereof with a longest dimension in the width direction. In this step, for example, a gate insulating film material is formed by a thermal oxidation method, and polysilicon is deposited thereon to form a gate electrode material, which is in turn etched to form a hollow rectangle having the slit SL1 extending in the width direction from opposite sides thereof, thus forming the first electrode 10.

FIG. 3B is an end view of the first electrode 10 along line B-B' of FIG. 3A. FIG. 3A is a cross sectional plan view corresponding to line C-C' of FIG. 3B. As shown in FIG. 3B, by the above process, the first electrode 10 is formed on the active region 3 (of the substrate 2) with the first insulating film 20 therebetween.

Next, as shown in FIG. 4A, the second electrode 12 is formed on the substrate 2 and the side surfaces of the first electrode 10 through the second insulating film 18. The second electrode 12 has a second work function different from the first work function. For example, after the second insulating film 18 is formed, the second electrode 12 is formed by a process of forming the side wall. By this process, the second electrode 12 is formed on both of the inner and outer side surfaces of the first electrode 10 with the second insulator 18 therebetween.

FIG. 4B is an end view of the first electrode 10 and the second electrode 12 along line B-B' of FIG. 4A. FIG. 4A is a cross sectional plan view corresponding to line C-C' of FIG. 4B. As shown in FIG. 4B, by the above process, the second insulating film 18 is formed on the active region 3 (of the substrate 2) and on both side surfaces of the first electrode 10. The second electrode 12 is formed on the side surfaces of the first electrode 10 on the active region 3 with the second insulating film 18 therebetween.

Next, as shown in FIG. 5A, a portion of the second electrode 12 formed on one side of the first electrode 10 is removed. By removing the portion of the second electrode 12, the source region 3a and the drain region 3b of the DWF-FET 4 are formed. The source region 3a of the DWF-FET 4 is a region of the active region 3 on the side in contact with the second electrode 12. Further, the drain region 3b is a region of the active region 3 on the side in contact with the first electrode 10 through the second insulating film 18. In FIG. 5A, the active region 3 in the rectangular hollow portion in the gate electrode G serves as the source region 3a, and the active region 3 outside the rectangle serves as the drain region 3b.

FIG. 5B is an end view of the first electrode 10 and the second electrode 12 along line B-B' of FIG. 5A. FIG. 5A is a cross sectional plan view corresponding to line C-C' of FIG. 5B. As shown in FIG. 5B, by the above process, the portion of the second electrode 12 on one side of the first electrode 10 (the side of the first electrode 10 facing away from the rectangular hollow portion of the gate electrode G) is removed, for example by masking and etching, and the portion of the second electrode 12 remains on the other side.

After the above process, the insulating side walls 14a and 14b are formed on the side surfaces of the first electrode 10 and the second electrode 12, respectively, through the second insulating film 18. Subsequently, by removing the portion of the side wall 14b formed on the side surface of the second electrode 12 in the slit SL2, the gate electrode as shown in FIG. 1, FIG. 2A and FIG. 2B is formed. The step of forming the side walls 14a and 14b, and the step of removing the side wall 14b formed in the slit may be carried out as the same step. In this case, after the insulating film that forms the side walls 14a and 14b is deposited on the substrate 2, anisotropic etching is performed.

Then, by the similar process to a normal MOSFET process, the source region 3a and the drain region 3b are formed. For example, the second insulating film 18 on the surface where the source region and the drain region are formed on the active region 3 is removed. Thereafter, impurities (dopants) are introduced into the active region 3, and activated by an annealing step, thus, the source region 3a and the drain region 3b are formed. Thereafter, the source electrode and the drain electrode are formed by a silicide process, and an interlayer insulating film is formed on the substrate over the semiconductor device 1.

Next, a plug region for coming into contact with the source electrode, the drain electrode and the gate electrode is formed by opening the interlayer insulating film using a lithography process or the like. Here, as shown in FIG. 1, the contact plug region 16 for the contact plug 5 of the gate electrode is formed to pass over the slit SL 1. More specifically, as shown in FIG. 2A, the contact plug region 16 is formed on the upper surface of each of the first electrode 10 and the second electrode 12, and the side surface of the second electrode 12 extending into the slit SL2. In this case, an element isolation insulating film is not removed, which is formed on the substrate 2, and separates the active region 3 from another neighboring active region. Further, after this step, the DWF-FET 4 is formed by a wiring step and the like.

As described above, according to the embodiment, the DWF-FET 4 is formed with the gate electrode G that includes the first electrode 10 having the first work function, and the second electrode 12 having the second work function different from the first work function. The first electrode 10 and the second electrode 12 are electrically connected by the contact plug 5 that is embedded in the contact plug region 16 formed on the DWF-FET 4. Further, since different work functions are provided, by applying voltage via the contact plug 5, in the gate region in the active region 3, depletion layers having different thicknesses can be generated on the source region 3a side and the drain region 3b side, respectively. As described above, according to the embodiment, the first electrode 10 and the second electrode 12 need not be electrically connected by the silicide; the electrodes may be electrically connected by the contact plug 5 directly.

In this case, as shown in FIG. 2A, the side surface of the second electrode 12 and the contact plug 5 are in contact with each other, thus, the contact area between the second electrode 12 and the contact plug 5 can be increased, as compared with a conventional structure. Therefore, it is possible to suppress the gate resistance between the second electrode 12 and the contact plug 5. Further, since the first electrode 10, the second electrode 12 and the contact plug 5 are contact with one another at the slit region provided in the first electrode 10, the contact plug region 16 can be formed without increasing a gate pad region. Further, by forming the contact plug region 16 in this manner, it is easy to align the contact plug region 16 in the manufacturing process.

(Modification 1)

Figure 6A:
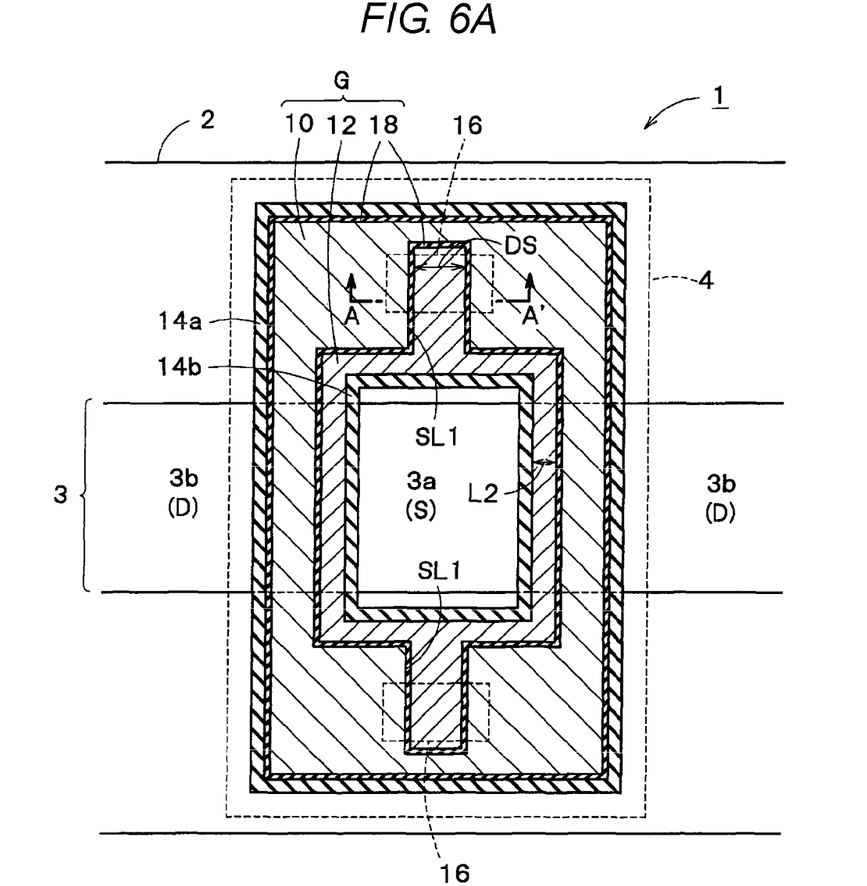
FIGS. 6A and 6B are a plan view and an end view showing the semiconductor device according to a modification, respectively.

In the embodiment described above, the case has been described in which the slit width DS of the slit SL1 in the first electrode 10 is twice the dimension L2 of the second electrode 12 in the length direction. On the other hand, when the contact area between the second electrode 12 and the contact plug 5 can be sufficiently large, the slit width DS can be less than or equal to twice the dimension L2 of the second electrode 12. FIG. 6A is a diagram showing the semiconductor device 1 in the case in which the slit width DS is less than or equal to twice the length L2 of the second electrode 12. In this case, the slit SL1 in the first electrode 12 is filled by the second electrode 12, with no slit SL2.

Figure 6B:
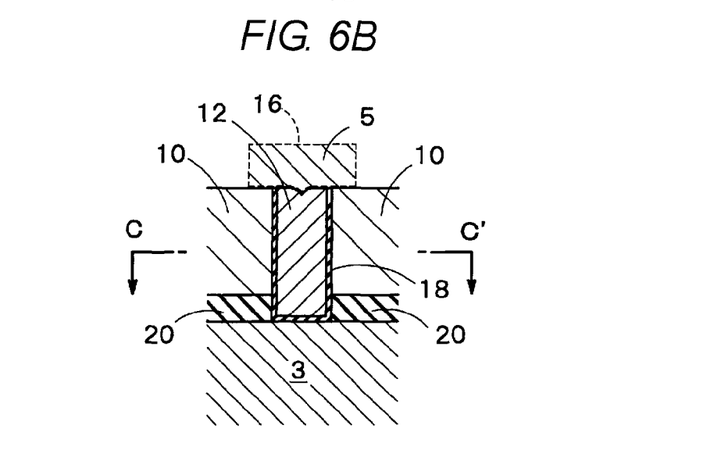

FIG. 6B is a diagram showing an end surface along line A-A' of FIG. 6A. FIG. 6A is a cross sectional plan view corresponding to line C-C' of FIG. 6B. As shown in FIG. 6B, the second electrode 12 is formed in the slit SL1 between opposing side surfaces of the first electrode 10 with the second insulating film 18 between the first electrode 10 and the second electrode 12. Then, on the upper surfaces of the first electrode 10 and the second electrode 12, the contact plug region 16 is formed in which the contact plug 5 is embedded.

With such a structure, it is possible to omit the step of removing the side wall 14b formed on the side surface of the second electrode 12 in the slit SL1 of the first electrode 10. Further, when the contact plug region 16 is opened, it is easy to process the element isolation insulating film that separates the active region 3 on the substrate 2 without removing it.

(Modification 2)

Although the slits SL1 are formed on opposite side surfaces outside of the active region 3 in the embodiment and modification 1 described above, when the area where the first electrode 10 and the second electrode 12 contact the contact plug 5 can be sufficiently secured, and the gate resistance can be reduced to an acceptable range, the slit SL 1 may be a single slit (with no slit on the opposite side).

Figure 7A:
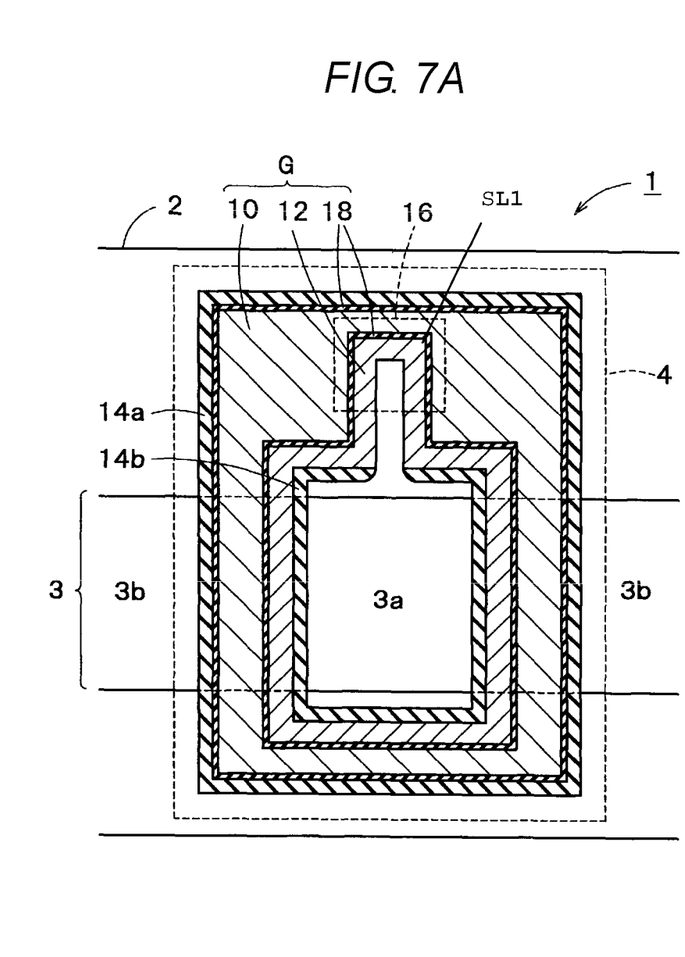
FIGS. 7A and 7B are plan views showing the semiconductor device according to another modification.
Figure 7B:
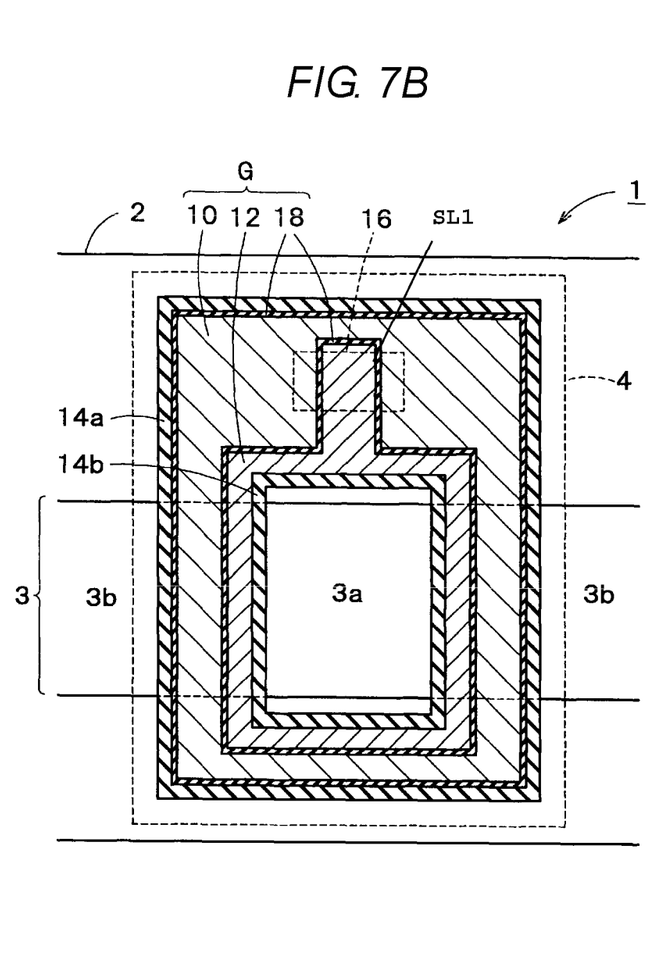

In FIG. 7A, a single slit SL1 is shown having width larger than twice the dimension of the second electrode 12 in the length direction. FIG. 7B shows a single slit SL1 with a width less than or equal to twice the dimension of the second electrode 12. As shown in FIG. 7A and FIG. 7B, in this case, the contact plug region 16 where the contact plug 5 is embedded is formed at the single slit SL 1. The other structure and process are similar to those of the embodiment described above.

As described above, also in the present modification, it is possible to secure the contact plug region 16 where the contact plug 5 is arranged for electrically connecting the first electrode 10 and the second electrode 12 having different work functions from each other. Even in the case where a region can be sufficiently secured only on one side (e.g., upper side in FIGS. 7A and 7B) passing over the active region 3 due to restriction of layout or the like, the similar structure is possible.

In addition, due to restriction of layout parameters, when a region where the slit SL1 is cut out can be secured only on one side passing over the active region 3, and when it is difficult to sufficiently secure, in a single slit SL1, a region where the second electrode 12 and the contact plug 5 are in contact with each other, two parallel slits SL1 can be formed on a region on one side of the active region 3. Thus, it is possible to form one, two, or more number of slits SL1, and multiple slits SL1 may be formed on the same side of the device or on opposite sides of the device.

Further, when no slit SL1 is formed on the active region 3, for example, multiple slits may be formed in one (upper) side and the other (lower) side of the active region 3, respectively. As the number of slits SL1 increases, it is possible to suppress the gate resistance between the contact plug 5 and the second electrode 12. Therefore, in consideration of the relationship between the value of the gate resistance and the layout, one, two, or three or more slits SL1 may be formed.

(Modification 3)

In the embodiment and modifications described above, the case has been described in which the active region 3 of the inner portion of the gate pad forming the gate electrode G serves as the source region 3a, and the region of the outer portion serves as the drain region 3b. However, the positions of the source regions 3a and the drain region 3b can be interchanged.

In the embodiment of modification 3, the region on the first electrode 10 side having the first work function in the active region 3 serves as the drain region 3b, and the range on the second electrode 12 side having the second work function larger than the first work function serves as the source region 3a. Therefore, contrary to the embodiment described above, the slit SL1 is provided on the outside rather than the inside of the first electrode 10 in the hollow rectangle, and the positions of the first and second electrodes 10 and 12 are reversed. Thus, the positional relationship between the source region 3a and the drain region 3b may be inverted with respect to the gate pad region where the gate electrode G is formed.

Figure 8A:
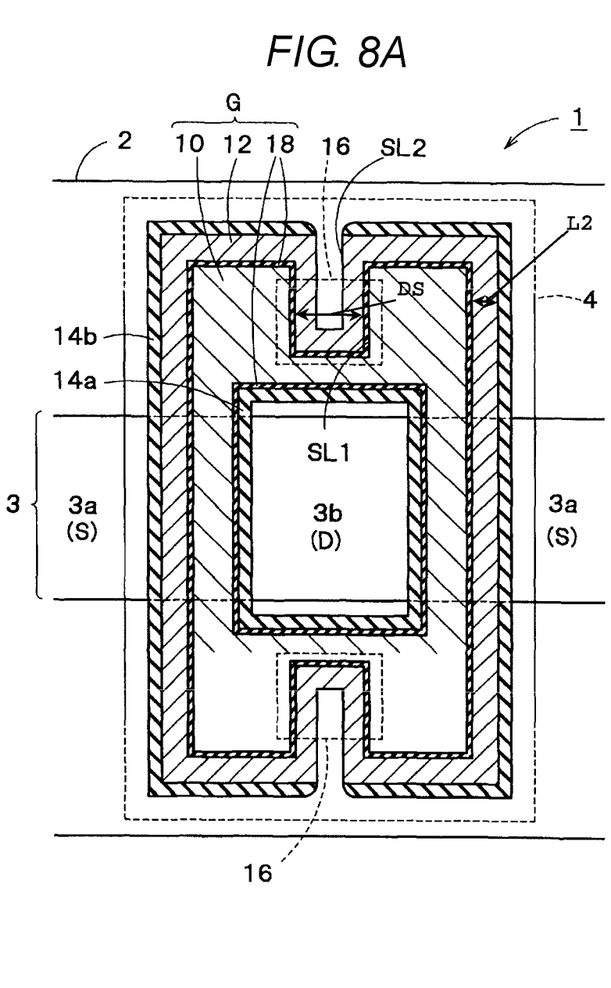
FIGS. 8A and 8B are plan views showing the semiconductor device according to still another modification.

FIG. 8A is a diagram showing the semiconductor device 1 in which the slit SL1 is provided outside the first electrode 10 (i.e. in the edge of the first electrode 10 facing away from the hollow rectangle). Note that since the structure and the process are the same as those of the embodiment described above except for the positional relationship between the first electrode 10 and the second electrode 12 and the position of the slit SL1, detailed explanation thereof is omitted.

As shown in FIG. 8A, in modification 3, the slit SL1 is provided outside the first electrode 10, and the second electrode 12 is formed outside the first electrode 10 through the second insulating film 18. The second electrode 12 where the side wall 14b is removed is formed in the slit SL1 outside the first electrode 10. The contact plug region 16 is formed so as to contact the upper surface of the first electrode 10 and the upper surface of the second electrode 12, and the side surface of the second electrode 12. The semiconductor device 1 according to the present modification can be produced by removing the second electrode 12 formed on the inner side surface of the first electrode 10 in the step of removing the second electrode 12.

As described above, the slit SL1 is provided outside the first electrode 10, and the second electrode 12 is formed on the outer periphery of the first electrode 10. Thus, the relationship between the source region 3a and the drain region 3b in the active region 3 can be inverted as compared to the embodiment and modifications described above. In other words, the active region 3 of the outer portion of the gate pad region may be the source region 3a, and the active region 3 of the inner portion of the gate pad may be the drain region 3b.

As described above, also in the present modification, the DWF-FET 4 may be formed in which the gate electrode G includes the first electrode 10 having the first work function, and the second electrode 12 having the second work function different from the first work function. The positional relationship between the source region 3a and the drain region 3b is inverted as compared to the embodiment described above with respect to the gate pad. Therefore, it is possible to control the direction of the drain current even in the case where the same conductivity type DWF-FET 4 is formed. As a result, it is possible to selectively use the DWF-FET 4 according to the embodiment described above, and the DWF-FET 4 according to the present modification depending on the needs in the circuit design and layout.

Figure 8B:
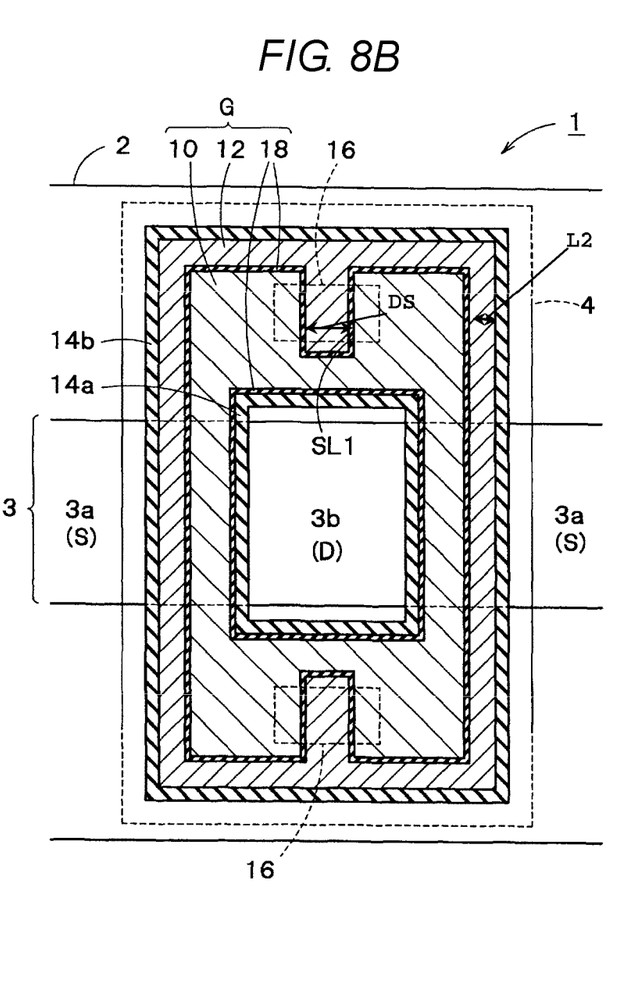
Figure 9A:
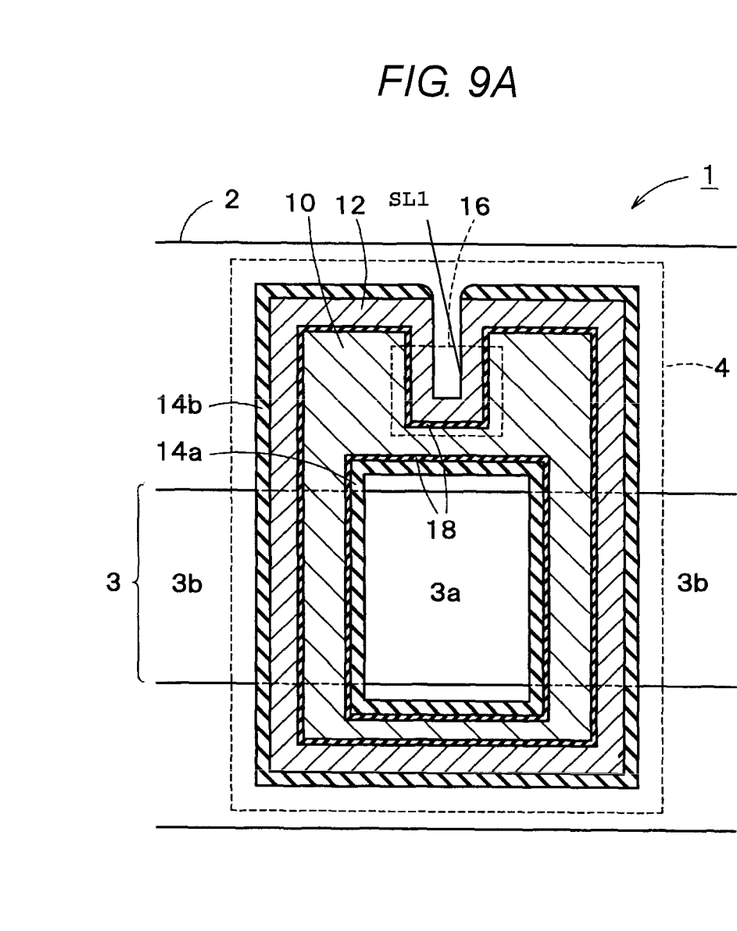
FIGS. 9A and 9B are plan views showing the semiconductor device according to yet another modification.
Figure 9B:
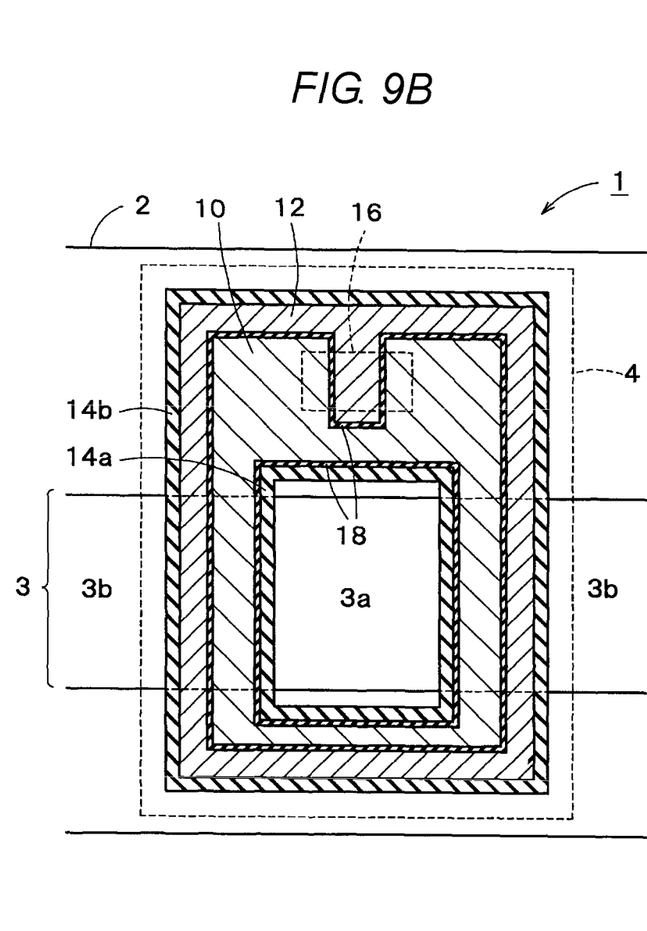

Note that in the semiconductor device 1 shown in FIG. 8A, the slit width DS of the slit SL1 in the first electrode 10 is larger than twice the dimension L2 of the second electrode 12 in the length direction, such that the slit SL2 is formed. Furthermore, as shown in FIG. 8B, the slit width DS of the slit SL1 in the first electrode 10 may be less than or equal to twice the dimension L2 of the second electrode 12, so there is no slit SL2. Moreover, as shown in FIG. 9A and FIG. 9B, in either case, a single slit SL1 is possible. The effect of this case is similar to that of the modifications described above. That is, depending on the needs in the layout and design of the transistor, the modifications shown in FIG. 8A, FIG. 8B, FIG. 9A and FIG. 9B may be freely selected and used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a substrate; and
a gate electrode, the gate electrode including a first electrode formed on the substrate, the first electrode comprising a first material having a first conductive property, with a first insulating film between the first electrode and the substrate, and a second electrode formed on the substrate, the second electrode comprising a second material having a second conductive property different from the first conductive property, with a second insulating film between the second electrode and the substrate, wherein the first electrode is formed in a rectangular shape having a hollow portion, a slit is formed in a side surface of the first electrode and extending along a width direction of the gate electrode, and the second electrode is formed in the slit and along the side surface of the first electrode that has the slit.

2. The device according to claim 1, wherein the slit formed in the first electrode does not penetrate the first electrode in the width direction of the gate electrode.

3. The device according to claim 2, wherein the gate electrode passes over an active region of the substrate.

4. The device according to claim 3, wherein the slit in the first electrode is formed over a region of the substrate different from the active region of the substrate.

5. The device according to claim 4, further comprising:
a contact plug formed to pass over the slit in the first electrode, the contact plug electrically connecting the first electrode and the second electrode.

6. The device according to claim 5, wherein the first electrode has the slit in an inner side surface of the first electrode facing the hollow portion.

7. The device according to claim 5, wherein the first electrode has the slit in an outer side surface of the first electrode facing away from the hollow portion.

8. The device according to claim 5, wherein the slit has a width more than twice as large as a dimension length of the second electrode in a length direction of the gate electrode.

9. The device according to claim 8, wherein the contact plug fills the slit between faces of the second electrode.

10. The device according to claim 5, wherein the slit has a slit width less than or equal to a dimension of the second electrode in a length direction of the gate electrode.

11. The device according to claim 10, wherein the contact plug is formed on the second electrode and the first electrode.

12. The device according to claim 1, wherein the first conductive property is a first work function, the second conductive property is a second work function, and the first work function is less than the second work function.

13. The device according to claim 12, further comprising:
a drain region formed in a portion of an active region on the first electrode side thereof; and
a source region formed in a portion of the active region on the second electrode side thereof,
wherein, based on a potential difference between the gate electrode and the source region, and a potential difference between the drain region and the source region, a transistor is formed for passing current between the source region and the drain region.

14. The device according to claim 1, wherein the first electrode has a plurality of slits in the side surface of the first electrode and extending along the width direction of the gate electrode.

15. A method of manufacturing a semiconductor device, including:
forming a first electrode having a first conductive property on a substrate, with a first insulating film between the first electrode and the substrate, the first electrode being formed in a rectangular shape having a hollow portion, and having a slit formed in a side surface of the first electrode and extending in a width direction of the semiconductor device;
forming a second electrode having a second conductive property different from the first conductive property on the substrate and on the side surface of the first electrode, with a second insulating film between the first electrode and the second electrode;
removing the second electrode from a side surface of the first electrode where no slit is formed to form a gate electrode; and
forming an insulating side wall on side surfaces of the gate electrode.

16. The method according to claim 15, wherein
the first electrode is formed to pass over an active region of the substrate, and
the second electrode is formed on a region different from the active region of the substrate.

17. The method according to claim 16, further comprising:
forming a source region and a drain region in the active region of the substrate;
forming silicide on the source region and the drain region;
forming an interlayer insulating film on the substrate; and
opening the interlayer insulating film to form, passing over the slit, a contact plug for electrically connecting the first electrode and the second electrode.

18. The method according to claim 17, wherein the slit has a slit width more than twice as large as a dimension of the second electrode in a length direction of the semiconductor device.

19. The method according to claim 18, further comprising:
removing a portion of the insulating side wall formed on the side surface of the second electrode in the slit;
wherein when the contact plug is formed, the contact plug is formed to fill the slit between faces of the second electrode.

20. The method according to claim 17, wherein the slit has a slit width less than or equal to twice as large as a dimension of the second electrode in a length direction of the semiconductor device.

* * * * *